United States Patent
Hashimoto

(10) Patent No.: US 12,274,042 B2
(45) Date of Patent: *Apr. 8, 2025

(54) RADIO WAVE ABSORBER AND COMPOUND

(71) Applicant: FUJIFILM Corporation, Tokyo (JP)

(72) Inventor: Hirokazu Hashimoto, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 630 days.

This patent is subject to a terminal disclaimer.

(21) Appl. No.: 17/503,509

(22) Filed: Oct. 18, 2021

(65) Prior Publication Data

US 2022/0039301 A1 Feb. 3, 2022

Related U.S. Application Data

(63) Continuation of application No. PCT/JP2020/011872, filed on Mar. 18, 2020.

(30) Foreign Application Priority Data

May 14, 2019 (JP) .................... 2019-091587

(51) Int. Cl.
| | | |
|---|---|---|
| H05K 9/00 | (2006.01) | |
| H01F 1/34 | (2006.01) | |
| H01F 1/37 | (2006.01) | |

(52) U.S. Cl.
CPC ........... *H05K 9/0075* (2013.01); *H01F 1/348* (2013.01); *H01F 1/37* (2013.01)

(58) Field of Classification Search
CPC .......... H05K 9/0075; H01F 1/37; H01F 1/348
See application file for complete search history.

(56) References Cited

U.S. PATENT DOCUMENTS

| | | | |
|---|---|---|---|
| 4,792,483 A * | 12/1988 | Miyake | ........... G11B 5/714 |
| 6,419,847 B1 | 7/2002 | Toyota et al. | |
| 10,249,417 B2 | 4/2019 | Morita | |
| 10,622,127 B2 | 4/2020 | Sakane et al. | |
| 10,919,778 B2 | 2/2021 | Sakane et al. | |
| 12,112,871 B2 | 10/2024 | Hashimoto | |
| 12,125,622 B2 | 10/2024 | Hashimoto | |
| 2003/0044623 A1 | 3/2003 | Sakurai et al. | |
| 2003/0044633 A1 * | 3/2003 | Nagaraj | ........... C23C 10/58 |
| | | | 428/615 |
| 2003/0079893 A1 | 5/2003 | Hashimoto et al. | |
| 2004/0036645 A1 | 2/2004 | Fujieda et al. | |
| 2004/0227663 A1 | 11/2004 | Suzuki et al. | |
| 2005/0282043 A1 | 12/2005 | Yamazaki et al. | |
| 2007/0131894 A1 | 6/2007 | Takada et al. | |
| 2007/0241962 A1 | 10/2007 | Shinoda et al. | |
| 2009/0266604 A1 | 10/2009 | Tokiwa | |
| 2010/0060539 A1 | 3/2010 | Suetsuna et al. | |
| 2010/0238063 A1 | 9/2010 | Ohkoshi et al. | |
| 2012/0100064 A1 | 4/2012 | Ohkoshi et al. | |
| 2012/0105185 A1 | 5/2012 | Oda et al. | |
| 2013/0140076 A1 | 6/2013 | Lee et al. | |
| 2014/0091501 A1 | 4/2014 | Hattori et al. | |
| 2015/0187380 A1 | 7/2015 | Shirata | |
| 2016/0276072 A1 * | 9/2016 | Sethumadhavan | ....... H01F 1/37 |
| 2017/0275438 A1 | 9/2017 | Kobayashi et al. | |
| 2018/0009677 A1 | 1/2018 | Aga et al. | |
| 2018/0370197 A1 | 12/2018 | Nagamune et al. | |
| 2019/0051436 A1 | 2/2019 | Imaoka et al. | |
| 2019/0215994 A1 | 7/2019 | Hiroi et al. | |
| 2019/0312356 A1 | 10/2019 | Fujita et al. | |
| 2019/0380232 A1 | 12/2019 | Machinaga et al. | |
| 2020/0008328 A1 | 1/2020 | Hiroi et al. | |
| 2020/0227833 A1 | 7/2020 | Hiroi et al. | |
| 2020/0335247 A1 | 10/2020 | Hosoya et al. | |
| 2021/0151895 A1 | 5/2021 | Ohkoshi et al. | |
| 2021/0166849 A1 | 6/2021 | Hashimoto | |
| 2021/0179442 A1 | 6/2021 | Chen | |
| 2021/0194147 A1 | 6/2021 | Nagano | |
| 2022/0059945 A1 | 2/2022 | Hashimoto | |
| 2022/0059946 A1 | 2/2022 | Hashimoto | |
| 2022/0061198 A1 | 2/2022 | Shirata et al. | |
| 2022/0167535 A1 | 5/2022 | Nakai et al. | |
| 2022/0376402 A1 | 11/2022 | Hashimoto | |

FOREIGN PATENT DOCUMENTS

| | | |
|---|---|---|
| CN | 102473514 A | 5/2012 |
| CN | 102473519 A | 5/2012 |
| CN | 107032776 A | 8/2017 |
| CN | 107227023 A | 10/2017 |
| CN | 107406272 A | 11/2017 |
| CN | 108370654 A | 8/2018 |
| CN | 109265155 A | 1/2019 |

(Continued)

OTHER PUBLICATIONS

English Translation for JP 2000-228599, Aug. 15, 2000.*
English translation for JP 2000-232294, Aug. 22, 2000.*
Englsih tanslation for JP 2005-231931, Sep. 2, 2005.*
Extended European Search Report issued Jul. 1, 2022 in European Application No. 20806852.8.
Communication issued Dec. 14, 2023 in European Application No. 20 806 133.3.
Office Action issued Oct. 31, 2023 in Korean Application No. 10-2022-7009991, corresponding to U.S. Appl. No. 17/697,268.
Office Action issued Jan. 12, 2024 in U.S. Appl. No. 17/518,889.
Chinese Office Action dated Mar. 6, 2024 in Application No. 202080035479.6.

(Continued)

*Primary Examiner* — C Melissa Koslow
(74) *Attorney, Agent, or Firm* — Sughrue Mion, PLLC

(57) ABSTRACT

A radio wave absorber including a radio wave absorbing layer containing a magnetic powder and a binder, in which a metal layer is not provided, a filling rate of the magnetic powder in the radio wave absorbing layer is 35% by volume or less, and in a case where the filling rate of the magnetic powder in the radio wave absorbing layer is denoted by P % by volume and a thickness of the radio wave absorbing layer is denoted by Q mm, the following relationship is satisfied, $0.65 \leq (P/100) \times Q$, and the compound.

9 Claims, No Drawings

(56) References Cited

FOREIGN PATENT DOCUMENTS

| | | |
|---|---|---|
| DE | 37 29 693 A1 | 5/1988 |
| EP | 2 708 513 A1 | 3/2014 |
| EP | 3 435 386 A1 | 1/2019 |
| EP | 3 573 439 A1 | 11/2019 |
| EP | 3 643 752 A1 | 4/2020 |
| EP | 3 943 451 A1 | 1/2022 |
| EP | 3 537 860 B1 | 10/2022 |
| JP | 57-180206 A | 11/1982 |
| JP | 63-155700 A | 6/1988 |
| JP | 64-00707 A | 1/1989 |
| JP | 5-206676 A | 8/1993 |
| JP | 7-30279 A | 1/1995 |
| JP | 8-340191 A | 12/1996 |
| JP | 9-115708 A | 5/1997 |
| JP | 11-354972 A | 12/1999 |
| JP | 2000-228599 * | 8/2000 |
| JP | 2000-228599 A | 8/2000 |
| JP | 2000-232294 * | 8/2000 |
| JP | 2000-232294 A | 8/2000 |
| JP | 2001-156487 A | 6/2001 |
| JP | 2002-118008 A | 4/2002 |
| JP | 2002-185180 A | 6/2002 |
| JP | 2002-217586 A | 8/2002 |
| JP | 2003-282319 A | 10/2003 |
| JP | 2003-332784 A | 11/2003 |
| JP | 2004-96084 A | 3/2004 |
| JP | 2004-296541 * | 10/2004 |
| JP | 2005-033156 A | 2/2005 |
| JP | 2005-231931 * | 9/2005 |
| JP | 2005-231931 A | 9/2005 |
| JP | 2007-129179 A | 5/2007 |
| JP | 2007-250823 A | 9/2007 |
| JP | 2008-021990 A | 1/2008 |
| JP | 2008-63199 A | 3/2008 |
| JP | 2008-169378 A | 7/2008 |
| JP | 4173424 B2 | 10/2008 |
| JP | 2008-300801 A | 12/2008 |
| JP | 2010-077198 A | 4/2010 |
| JP | 2010-114407 A | 5/2010 |
| JP | 2010-184840 A | 8/2010 |
| JP | 2010-260766 A | 11/2010 |
| JP | 2010-283301 A | 12/2010 |
| JP | 4674380 B2 | 4/2011 |
| JP | 2011-093762 A | 5/2011 |
| JP | 2011-178654 A | 9/2011 |
| JP | 2012-009797 A | 1/2012 |
| JP | 5161813 B2 | 3/2013 |
| JP | 2013-526775 A | 6/2013 |
| JP | 2013-239637 A | 11/2013 |
| JP | 5481538 B2 | 4/2014 |
| JP | 2015-127985 A | 7/2015 |
| JP | 2016-204499 A | 12/2016 |
| JP | 2018-056492 A | 4/2018 |
| JP | 2018-110167 A | 7/2018 |
| JP | 2018-147999 A | 9/2018 |
| JP | 2018-154541 A | 10/2018 |
| JP | 2019-12799 A | 1/2019 |
| JP | 6521415 B2 | 5/2019 |
| JP | 2019-104954 A | 6/2019 |
| KR | 10-0675514 B1 | 1/2007 |
| WO | 2016/117648 A1 | 7/2016 |
| WO | 2018/084234 A1 | 5/2018 |
| WO | 2018/168859 A1 | 9/2018 |
| WO | 2018/235952 A1 | 12/2018 |
| WO | 2019/004104 A1 | 1/2019 |
| WO | 2019/017471 A1 | 1/2019 |
| WO | 2019/131675 A1 | 7/2019 |

OTHER PUBLICATIONS

Communication dated Apr. 2, 2024, issued in Chinese Application No. 202080056518.0.
Office Action issued Dec. 21, 2023 in U.S. Appl. No. 17/173,437.
Clarivate Analytics machine translation of JP 5161813 B2 to Hitomi et al. published Mar. 13, 2013 (Year: 2013), 20 pages total.
Vinnik et al. "Growth of lead and aluminum substituted barium hexaferrite single crystals from lead oxide flux", Materials Science Forum, vol. 843, pp. 3-9. Published online Dec. 28, 2015 (Year: 2015), 7 pages total.
Shono et al. "Magneto-optical properties of magnetoplumbites BaFe12O19, SrFe12—xAlxO19 and PbFe12O19", Japanese Journal of Applied Physics, vol. 21, No. 10, pp. 1451-1454. Oct. 1982 (Year: 1982), 5 pages total.
Naoufal et al. "Synthesis, structure and catalytic properties of Fe-substituted barium hexaaluminates", Catalyst Letters, 54, 1998, 141-148. Sep. 1998 (Year: 1998), 8 pages total.
Luo et al. "Physical and magnetic properties of highly aluminum doped strontium ferrite nanoparticles prepared by auto-combustion route", Journal of Magnetism and Magnetic Materials, 324, 2012, 2602-2608. published online Mar. 15, 2012 (Year: 2012), 7 pages total.
Notice of Allowance issued Apr. 22, 2024 in U.S. Appl. No. 17/518,889.
Japanese Office Action dated Apr. 18, 2023 in Japanese Application No. 2021-519287.
Communication dated Dec. 15, 2023, issued in Chinese Application No. 202080033792.6.
International Search Report issued Jun. 30, 2020 in International Applicaton No. PCT/JP2020/011872.
International Preliminary Report on Patentability issued Nov. 16, 2021 in International Applicaton No. PCT/JP2020/011872.
Notice of Reasons for Refusal dated Oct. 25, 2022 from the Japanese Patent Office in Japanese Application No. 2021-519287.
Office Action issued Nov. 30, 2023 in U.S. Appl. No. 17/518,825.
Office Action issued Oct. 28, 2023 in Chinese Application No. 202080035150.X.
Korean Office Action issued Sep. 25, 2023 in Application No. 10-2022-7004173.
Office Action issued Aug. 22, 2023 in European Application No. 20806852.8.
Office Action dated Dec. 13, 2022 from the Korean Intellectual Property Office in KR Application No. 10-2021-7034485.
Office Action issued Sep. 26, 2023 in Japanese Application No. 2021-519287.
Office Action issued May 25, 2023 in U.S. Appl. No. 17/518,825.
K. Sadhana et al., "Structural and magnetic properties of nanocrystalline $BaFe_{12}O_{19}$ synthesized by microwave-hydrothermal method", Appl Nanosci, 2012, vol. 2, pp. 247-252 (6 pages).
Office Action issued Nov. 28, 2022 in Korean Application No. 10-2021-7035736.
Office Action issued Oct. 25, 2022 in Japanese Application No. 2021-519388.
Extended European Search Report dated Jun. 13, 2022 from the European Patent Office in EP Application No. 20806133.3.
International Search Report dated Aug. 25, 2020 in International Application No. PCT/JP2020/018621.
International Preliminary Report on Patentability dated Nov. 16, 2021 in International Application No. PCT/JP2020/018621.
Extended European Search Report dated May 30, 2022 in European Application No. 20805058.3.
Notice of Reasons for Refusal dated Jun. 21, 2022 from the Japanese Patent Office in Japanese Application No. 2021-519405.
Japanese Office Action dated Dec. 20, 2022 in Japanese Application No. 2021-519405.
Korean Office Action dated Dec. 19, 2022 in Korean Application No. 10-2021-7036224.
Office Action issued Jun. 29, 2023 in Korean Application No. 10-2021-7036224.
International Search Report issued Aug. 25, 2020 in International Application No. PCT/JP2020/018622.
International Preliminary Report on Patentability issued Nov. 16, 2021 in International Application No. PCT/JP2020/018622.
Extended European Search Report dated May 30, 2022 in EP Application No. 20806265.3.
Office Action dated Jun. 21, 2022 issued from the Japanese Patent Office in JP Application No. 2021-519406.

(56) References Cited

OTHER PUBLICATIONS

Korean Office Action dated Dec. 19, 2022 in Korean Application No. 10-2021-7036117.
International Search Report dated Oct. 20, 2020 issued by the International Searching Authority in Application No. PCT/JP2020/029622.
International Preliminary Report on Patentability dated Feb. 8, 2022 with a Translation of the Written Opinion of the International Searching Authority in Application No. PCT/JP2020/029622.
Extended European Search Report dated Sep. 30, 2022 in EP Application No. 20852946.1.
Office Action dated Feb. 14, 2023 from the Japanese Patent Office in JP Application No. 2021-539210.
Office Action dated Mar. 21, 2023 from the Korean Intellectual Property Office in KR Application No. 10-2022-7004173.
International Search Report dated Aug. 13, 2019 from the International Searching Authority in International Application No. PCT/JP2019/022347.
International Preliminary Report on Patentability dated Mar. 2, 2021 from the International Bureau in International Application No. PCT/JP2019/022347.
Extended European Search Report issued Oct. 1, 2021 in European Application No. 19854513.9.
Notification of Reason for Refusal dated Jan. 14, 2022 from the Korean intellectual Property Office in KR Application No. 10-2021-7004268.
International Search Report dated Dec. 8, 2020 in International Application No. PCT/JP2020/033846.
International Preliminary Report on Patentability dated Apr. 5, 2022 in International Application No. PCT/JP2020/033846.
Extended European Search Report dated Oct. 24, 2022 in European Application No. 20871943.5.
Korean Office Action dated Apr. 7, 2023 in Korean Application No. 10-2022-7009991.
European Office Action dated Apr. 14, 2023 in European Application No. 20871943.5.
Office Action issued Aug. 3, 2023 in Chinese Application No. 202080035152.9.
Office Action dated Jul. 25, 2023 in Japanese Application No. 2021-539210.
International Search Report issued Aug. 18, 2020 in International Application No. PCT/JP2020/018479.
International Preliminary Report on Patentability issued Nov. 16, 2021 in International Application No. PCT/JP2020/018479.
Office Action issued May 8, 2024 in European Application No. 20 806 852.8.
Office Action issued May 6, 2024 in U.S. Appl. No. 17/517,910.
Office Action issued May 9, 2024 in U.S. Appl. No. 17/697,268.
B.D. Cullity, et al., "Introduction To Magnetic Materials", 2nd Edition, 2009 by the Institute of Electrical and Electronics Engineers, John Wiley & Sons, Inc., 2009, pp. 1-550 (550 pages total).
Retno Rahmawati, et al., "Optimization of Frequency and Stirring Rate for Synthesis of Magnetite ($Fe_3O_4$) Nanoparticles by Using Coprecipitation—Ultrasonic Irradiation Methods", Procedia Engineering, 2017, vol. 170, pp. 55-59 (5 pages total).
Md Jafar Sharif, et al., "Enhanced magnetization in highly crystalline and atomically mixed bcc Fe—Co nanoalloys prepared by hydrogen reduction of oxide composites", Nanoscale, 2013, vol. 5, pp. 1489-1493 (5 pages total).
Notice of Allowance issued Jul. 3, 2024 in U.S. Appl. No. 17/518,825.
S. Kolev, et al., "Thermal Treatment Influence on the Magnetic Properties and Degree of Orientation of $BaFe_{12}O_{19}$ Films", J Supercond Nov Magn, 2012, vol. 25, pp. 2819-2824 (6 pages total).
Office Action issued Jul. 3, 2024 in U.S. Appl. No. 17/173,437.
Office Action issued Jul. 23, 2024 in European Application No. 20 805 058.3.
Office Action issued Jul. 20, 2024 in Chinese Application No. 202080033792.6.
Office Action issued Aug. 27, 2024 in U.S. Appl. No. 17/697,268.
Japanese Office Action dated Oct. 1, 2024 in Application No. 2023-111034.
Notice of Allowance dated Nov. 14, 2024 in U.S. Appl. No. 17/173,437.
Office Action issued Dec. 23, 2024 in U.S. Appl. No. 17/697,268.
Notice of Allowance issued Oct. 9, 2024 in U.S. Appl. No. 17/517,910.
Translation of JP 2010-077198 (of record) published Apr. 8, 2010.
Office Action issued Feb. 11, 2025, in U.S. Appl. No. 17/666,894.

* cited by examiner

RADIO WAVE ABSORBER AND COMPOUND

CROSS-REFERENCE TO RELATED APPLICATIONS

This application is a Continuation of PCT International Application No. PCT/JP2020/011872 filed on Mar. 18, 2020, which claims priority under 35 U.S.C § 119(a) to Japanese Patent Application No. 2019-091587 filed on May 14, 2019. Each of the above application(s) is hereby expressly incorporated by reference, in its entirety, into the present application.

BACKGROUND OF THE INVENTION

1. Field of the Invention

The present disclosure relates to a radio wave absorber and a compound.

2. Description of the Related Art

In recent years, along with the diversification of the use pattern of radio waves in high frequency bands, such as electronic toll collection system (ETC), advanced cruise-assist highway systems (AHS), and satellite broadcasting, malfunctions and failures of electronic devices due to radio wave interference have been problems. In order to reduce the influence of such radio wave interference on electronic devices, a radio wave absorber absorbs unnecessary radio waves to prevent the reflection of the radio waves.

For example, JP2018-56492A discloses a radio wave absorbing sheet which has a flexible radio wave absorbing layer containing a radio wave absorbing material having a particle shape and a binder made of a resin, in which the radio wave absorbing material is a magnetic iron oxide that magnetically resonates in a frequency band of a millimeter wave band or a higher band and an easily magnetizable axis of the radio wave absorbing material is magnetically aligned in one in-plane direction of the radio wave absorbing sheet.

SUMMARY OF THE INVENTION

In a radio wave absorber, both a high reflection attenuation amount and a high transmission attenuation amount are required, and specifically, both the reflection attenuation amount and the transmission attenuation amount are required to be 10 dB or more.

As a method of increasing the reflection attenuation amount of the radio wave absorber, there is a method of providing a reflective layer that reflects radio waves on a side (a so-called rear side), opposite to a side where the radio waves of a radio wave absorbing layer are incident. Generally, a layer containing a metal (a so-called metal layer) is used as the reflective layer; however, in recent years, there is a tendency to avoid using the metal layer from the viewpoint of recycling. Further, the radio wave absorber having a metal layer has problems in that the radio wave absorbing layer and the metal layer are easily peeled off, the metal layer itself is easily deteriorated, and the cost is high. As a result, it is desirable to design a radio wave absorber in which a metal layer is not provided.

However, in the generally used dielectric radio wave absorber, in a case of intending to secure the transmission attenuation amount, the reflection attenuation amount becomes small in a case where the metal layer is not provided.

In the related art, it has been difficult to improve both the reflection attenuation amount and the transmission attenuation amount in the radio wave absorber in which a metal layer is not provided.

Regarding the above points, JP2018-56492A does not pay any attention to the problems occurring in the case of having a metal layer and also does not describe anything about increasing both the reflection attenuation amount and the transmission attenuation amount in the radio wave absorber in which a metal layer is not provided.

An object to be achieved by an aspect of the present invention is to provide a radio wave absorber in which a metal layer is not provided and both the transmission attenuation amount and the reflection attenuation amount in the millimeter wave band are 10 dB or more.

Another object to be achieved by an aspect of the present invention is to provide a compound that is used for producing the radio wave absorber.

A technique for achieving the objects includes the following aspects.

<1> A radio wave absorber comprising a radio wave absorbing layer containing a magnetic powder and a binder, in which a metal layer is not provided, a filling rate of the magnetic powder in the radio wave absorbing layer is 35% by volume or less, and in a case where the filling rate of the magnetic powder in the radio wave absorbing layer is denoted by P % by volume and a thickness of the radio wave absorbing layer is denoted by Q mm, the following relationship is satisfied, $0.65 \leq (P/100) \times Q$.

<2> The radio wave absorber according to <1>, in which the thickness of the radio wave absorbing layer is 10 mm or less, and the filling rate is 8% by volume or more and 35% by volume or less.

<3> The radio wave absorber according to <1> or <2>, in which the thickness of the radio wave absorbing layer is 5 mm or less, and the filling rate is 15% by volume or more and 35% by volume or less.

<4> The radio wave absorber according to any one of <1> to <3>, in which the magnetic powder includes a powder of a magnetoplumbite-type hexagonal ferrite.

<5> The radio wave absorber according to any one of <1> to <4>, in which the magnetic powder includes a powder of a magnetoplumbite-type hexagonal ferrite represented by Formula (1), $$AFe_{(12-x)}Al_xO_{19} \qquad \text{Formula (1)}$$

In Formula (1), A represents at least one kind of metal element selected from the group consisting of Sr, Ba, Ca, and Pb, and x satisfies $1.5 \leq x \leq 8.0$.

<6> The radio wave absorber according to <5>, in which A in Formula (1) is Sr.

<7> The radio wave absorber according to <5> or <6>, in which x in Formula (1) satisfies $1.5 \leq x \leq 6.0$.

<8> The radio wave absorber according to any one of <1> to <7>, in which in a case where a mode is denoted by a mode diameter, a 10% cumulative diameter is denoted by $D_{10}$, and a 90% cumulative diameter is denoted by $D_{90}$ in a number-based particle size distribution measured by a laser diffraction and scattering method, the magnetic powder has a mode diameter of 5 μm or more and less than 10 μm, and satisfies, $(D_{90}-D_{10})$/mode diameter $\leq 3.0$.

<9> The radio wave absorber according to any one of <1> to <8>, in which the radio wave absorber has a planar shape.

<10> The radio wave absorber according to any one of <1> to <8>, in which the radio wave absorber has a three-dimensional shape.

<11> A compound that is used for producing the radio wave absorber according to any one of <1> to <10>, the compound comprising a magnetic powder and a binder, in which a filling rate of the magnetic powder is 35% by volume or less.

According to an aspect of the present invention, a radio wave absorber in which a metal layer is not provided and both the transmission attenuation amount and the reflection attenuation amount in the millimeter wave band are 10 dB or more is provided.

According to another aspect of the present invention, a compound that is used for producing the radio wave absorber is provided.

DESCRIPTION OF THE PREFERRED EMBODIMENTS

Hereinafter, examples of embodiments of a radio wave absorber to which the present invention is applied will be described. However, the present invention is not limited to the embodiments hereinafter and can be appropriately implemented by adding modifications within the scope of the object of the present invention.

A range of numerical values shown using "to" in the present disclosure means a range including numerical values before and after "to" as a minimum value and a maximal value.

In the range of numerical values disclosed stepwise in the present disclosure, an upper limit value and a lower limit value disclosed in a certain range of numerical values may be replaced with an upper limit value and a lower limit value disclosed in another range of numerical values disclosed in stepwise. In addition, in the range of numerical values disclosed in the present disclosure, an upper limit value and a lower limit value disclosed in a certain range of numerical values may be replaced with values shown in examples.

In the present disclosure, a combination of two or more preferred aspects is a more preferred aspect.

In the present disclosure, in a case where plural kinds of substances corresponding to each component are present, an amount of each component means the amount of all of the plural kinds of substances, unless otherwise noted.

In the present disclosure, the term "step" includes not only an independent step but also a step that cannot be clearly distinguished from other steps, as long as the intended purpose of the step is achieved.

In the present disclosure, the transformation coefficient from the non-SI unit "Oe" to the SI unit "A/m" is "$10^3/4\pi$". Here, "$\pi$" is 3.1416.

In the present disclosure, the transformation coefficient from the non-SI unit "emu" to the SI unit "$A \cdot m^2$" is "$10^{-3}$".

[Radio Wave Absorber]

The radio wave absorber of the present disclosure is a radio wave absorber including a radio wave absorbing layer containing a magnetic powder and a binder, in which a metal layer is not provided, a filling rate of the magnetic powder in the radio wave absorbing layer is 35% by volume or less, and in a case where the filling rate of the magnetic powder in the radio wave absorbing layer is denoted by P % by volume and a thickness of the radio wave absorbing layer is denoted by Q mm, the following relationship is satisfied, $0.65 \leq (P/100) \times Q$.

Since the radio wave absorber of the present disclosure includes a radio wave absorbing layer containing a magnetic powder and a binder, where a filling rate of the magnetic powder in the radio wave absorbing layer is 35% by volume or less, and in a case where the filling rate of the magnetic powder in the radio wave absorbing layer is denoted by P % by volume and a thickness of the radio wave absorbing layer is denoted by Q mm, the following relationship is satisfied, $0.65 \leq (P/100) \times Q$, both the transmission attenuation amount and the reflection attenuation amount in the millimeter wave band are 10 dB or more although a metal layer is not provided.

According to the radio wave absorber in which both the transmission attenuation amount and the reflection attenuation amount are 10 dB or more, at least 90% of the radio waves can be absorbed.

~Configuration of Radio Wave Absorber~

The radio wave absorber of the present disclosure is a radio wave absorber in which a radio wave absorbing layer is provided and a metal layer is not provided.

In the present disclosure, the "metal layer" means a layer containing a metal and substantially reflecting radio waves. Here, "substantially reflecting radio waves" means, for example, reflecting 90% or more of incident radio waves.

Examples of the metal layer include a metal plate and a metal foil and may be, for example, a thin metal film formed by vapor deposition. The metal layer is generally formed on the side of the radio wave absorbing layer, opposite to the side where radio waves are incident.

The layer corresponding to the radio wave absorbing layer is not included in the "metal layer" in the present disclosure.

The radio wave absorber of the present disclosure may have a layer (a so-called another layer) other than the radio wave absorbing layer, as necessary, as long as the effect of the radio wave absorber of the present disclosure is not impaired.

Examples of another layer include a protective layer, an adhesive layer, and a peeling layer.

Further, the radio wave absorber of the present disclosure may have a metal-free reflective layer as another layer as long as the effect of the radio wave absorber of the present disclosure is not impaired. However, an aspect in which a metal-free reflective layer is not provided is preferable.

~Shape of Radio Wave Absorber~

The radio wave absorber of the present disclosure may have a planar shape or a three-dimensional shape.

The planar shape is not particularly limited, and examples thereof include a sheet shape and a film shape.

Examples of the three-dimensional shape include a tubular shape (a cylindrical shape, rectangular tubular shape, or the like), a horn shape, and a box shape (provided that one of the surfaces thereof is open).

[Radio Wave Absorbing Layer]

The radio wave absorbing layer contains a magnetic powder and a binder.

Details of the components contained in the radio wave absorbing layer will be described later.

The filling rate of the magnetic powder in the radio wave absorbing layer is 35% by volume or less, preferably 8% by volume or more and 35% by volume or less, more preferably 15% by volume or more and 35% by volume or less, still more preferably 20% by volume or more and 35% by volume or less, and particularly preferably 25% by volume or more and 35% by volume or less.

In a case where the filling rate of the magnetic powder in the radio wave absorbing layer is 35% by volume or less, the radio wave absorber can realize a reflection attenuation amount of 10 dB or more even in a case of having no metal layer.

The filling rate of the magnetic powder in the radio wave absorbing layer is a value obtained by the measurement with the following method using a scanning electron microscope (SEM) and the calculation.

A radio wave absorbing layer is cut into a size of 5 mm×5 mm. After the cut radio wave absorbing layer is attached to a stage, the cross section is processed in the thickness direction using a focused ion beam (FIB). After setting the processed radio wave absorbing layer on a stage so that the cross section is upward, a cross-section SEM image having a visual field of 30 µm×40 µm is obtained using a field emission scanning electron microscope (FE-SEM) under the conditions of a pressurization voltage of 15 kV and an observation magnification of 3,000 folds. The obtained cross-section SEM image is subjected to binarization processing, the proportion of the magnetic powder is determined, and the filling rate of the magnetic powder is calculated.

The above operation is carried out 5 times at different cutting points of the radio wave absorbing layer, and the arithmetic mean value of the calculated values is taken as the filling rate of the magnetic powder in the radio wave absorbing layer. The arithmetic mean value is rounded off to the first decimal place.

As the focused ion beam (FIB) device, for example, a high-performance focused ion beam (FIB) device (product name: MI4050), manufactured by Hitachi, Ltd., can be suitably used. However, the focused ion beam (FIB) device is not limited to this.

As the field emission scanning electron microscope (FE-SEM), for example, a field emission scanning electron microscope (product name: SU-8220), manufactured by Hitachi, Ltd., can be suitably used. However, the field emission scanning electron microscope (FE-SEM) is not limited to this.

In a case where the filling rate of the magnetic powder in the radio wave absorbing layer is denoted by P % by volume and a thickness of the radio wave absorbing layer is denoted by Q mm, the radio wave absorbing layer satisfies a relationship of $0.65 \leq (P/100) \times Q$, preferably satisfies a relationship of $0.65 \leq (P/100) \times Q \leq 5.0$, more preferably satisfies a relationship of $0.65 \leq (P/100) \times Q \leq 3.5$, still preferably satisfies a relationship of $0.65 \leq (P/100) \times Q \leq 1.75$, and particularly preferably satisfies a relationship of $0.65 \leq (P/100) \times Q \leq 1.0$.

In a case where the relationship of $0.65 \leq (P/100) \times Q$ is satisfied, the radio wave absorber can realize a transmission attenuation amount of 10 dB or more.

The thickness of the radio wave absorbing layer is not particularly limited as long as the above-described relationship of "$0.65 \leq (P/100) \times Q$" is satisfied.

The thickness of the radio wave absorbing layer is, for example, preferably 20 mm or less, more preferably 10 mm or less, and still more preferably 5 mm or less, from the viewpoint of the degree of freedom of the installation location.

The lower limit of the thickness of the radio wave absorbing layer is not particularly limited; however, it is, for example, preferably 2 mm or more from the viewpoint of mechanical properties.

The thickness of the electromagnetic wave absorbing layer is a value measured using a digital length measuring machine and, specifically, is an arithmetic mean value of the measured values measured at nine points which are randomly selected.

As the digital length measuring machine, for example, a digital length measuring machine [product name: Litematic (registered trade name) VL-50A] manufactured by Mitutoyo Corporation can be suitably used. However, the digital length measuring machine is not limited to this.

The aspect satisfying a relationship of $0.65 \leq (P/100) \times Q$ is, for example, preferably an aspect in which the thickness of the radio wave absorbing layer is 10 mm or less, and the filling rate of the magnetic powder in the radio wave absorbing layer is 8% by volume or more and 35% by volume or less, more preferably an aspect in which the thickness of the radio wave absorbing layer is 5 mm or less, and the filling rate of the magnetic powder in the radio wave absorbing layer is 15% by volume or more and 35% by volume or less, and still more preferably an aspect in which the thickness of the radio wave absorbing layer is 2 mm or more and 5 mm or less, and the filling rate of the magnetic powder in the radio wave absorbing layer is 20% by volume or more and 35% by volume or less.

<Magnetic Powder>

The radio wave absorbing layer contains magnetic powder.

The magnetic powder is not particularly limited, and examples thereof include powders of ferrite, iron oxide, cobalt, chromium oxide, and the like.

From the viewpoint of radio wave absorption performance, it is preferable that the magnetic powder contains, for example, a powder of a magnetoplumbite-type hexagonal ferrite (hereinafter, also referred to as a "magnetoplumbite-type hexagonal ferrite powder"), and it is more preferable that the magnetic powder is a magnetoplumbite-type hexagonal ferrite powder.

The magnetoplumbite-type hexagonal ferrite is a chemical compound generally represented by a composition formula $A^1Fe_{12}O_{19}$ (in the formula, $A^1$ is a metal element such as Sr, Ba, Ca, or Pb).

However, in the concept of the "magnetoplumbite-type hexagonal ferrite" in the present disclosure, magnetoplumbite-type hexagonal ferrite represented by Formula (1) described later is also included in addition to the magnetoplumbite-type hexagonal ferrite represented by the composition formula $A^1Fe_{12}O_{19}$.

For example, from the viewpoint of operability and handleability, $A^1$ is preferably at least one kind of metal element selected from the group consisting of Sr, Ba, Ca, and Pb.

It is preferable that the magnetic powder preferably contains, for example, a powder of a magnetoplumbite-type hexagonal ferrite represented by Formula (1), and it is more preferable that the magnetic powder is a powder of a magnetoplumbite-type hexagonal ferrite represented by Formula (1), due to the fact that excellent magnetic properties and excellent radio wave absorption performance even in the high frequency band can be exhibited.

Hereinafter, the magnetoplumbite-type hexagonal ferrite represented by Formula (1) is also referred to as a "specific magnetoplumbite-type hexagonal ferrite". Further, the powder of a specific magnetoplumbite-type hexagonal ferrite is also referred to as a "specific magnetoplumbite-type hexagonal ferrite powder".

$$AFe_{(12-x)}Al_xO_{19} \quad \text{Formula (1)}$$

In Formula (1), A represents at least one kind of metal element selected from the group consisting of Sr, Ba, Ca, and Pb, and x satisfies $1.5 \leq x \leq 8.0$.

Regarding the A in Formula (1), the kind or number of metal elements are not particularly limited as long as the A is at least one kind of metal element selected from the group consisting of Sr, Ba, Ca, and Pb.

For example, from the viewpoint of operability and handleability, the A in Formula (1) is preferably at least one kind of metal element selected from the group consisting of Sr, Ba, and Ca.

In addition, for example, the A in Formula (1) preferably contains Sr and is more preferably Sr, due to the fact that an excellent radio wave absorption performance can be exhibited near 79 GHz.

x in Formula (1) satisfies $1.5 \leq x \leq 8.0$, preferably satisfies $1.5 \leq x \leq 6.0$, more preferably satisfies $1.5 \leq x \leq 4.0$, and still more preferably satisfies $1.5 \leq x \leq 3.0$.

In a case where x in Formula (1) is 1.5 or more, radio waves in a frequency band higher than 60 GHz can be absorbed.

In a case where x in Formula (1) is 8.0 or less, the magnetoplumbite-type hexagonal ferrite has magnetism.

Examples of the specific magnetoplumbite-type hexagonal ferrite include $SrFe_{(10.44)}Al_{(1.56)}O_{19}$, $SrFe_{(10.00)}Al_{(2.00)}O_{19}$, $SrFe_{(9.95)}Al_{(2.05)}O_{19}$, $SrFe_{(9.85)}Al_{(2.15)}O_{19}$, $SrFe_{(9.79)}Al_{(2.21)}O_{19}$, $SrFe_{(9.74)}Al_{(2.26)}O_{19}$, $SrFe_{(9.70)}Al_{(2.30)}O_{19}$, $SrFe_{(9.58)}Al_{(2.42)}O_{19}$, $SrFe_{(9.37)}Al_{(2.63)}O_{19}$, $SrFe_{(9.33)}Al_{(2.67)}O_{19}$, $SrFe_{(9.27)}Al_{(2.73)}O_{19}$, $SrFe_{(7.88)}Al_{(4.12)}O_{19}$, $SrFe_{(7.71)}Al_{(4.29)}O_{19}$, $SrFe_{(7.37)}Al_{(4.63)}O_{19}$, $SrFe_{(7.04)}Al_{(4.96)}O_{19}$, $SrFe_{(6.25)}Al_{(5.75)}O_{19}$, $BaFe_{(9.50)}Al_{(2.50)}O_{19}$, $BaFe_{(10.05)}Al_{(1.95)}O_{19}$, $CaFe_{(10.00)}Al_{(2.00)}O_{19}$, $PbFe_{(9.00)}Al_{(3.00)}O_{19}$, $Sr_{(0.80)}Ba_{(0.10)}Ca_{(0.10)}Fe_{(9.83)}Al_{(2.17)}O_{19}$, and $Sr_{(0.80)}Ba_{(0.10)}Ca_{(0.10)}Fe_{(8.85)}Al_{(3.15)}O_{19}$.

For example, $SrFe_{(10.00)}Al_{(2.00)}O_{19}$ is a specific magnetoplumbite-type hexagonal ferrite having a resonance frequency near 76.5 GHz, and $SrFe_{(9.70)}Al_{(2.30)}O_{19}$ is a specific magnetoplumbite-type hexagonal ferrite having a resonance frequency near 85.0 GHz.

The method of producing the specific magnetoplumbite-type hexagonal ferrite powder will be described later.

The composition of the magnetoplumbite-type hexagonal ferrite is checked by high frequency inductively coupled plasma (ICP) emission spectroscopy.

Specifically, a pressure-resistant container containing 12 mg of sample powder and 10 mL of a 4 mol/L (liter; the same applies hereinafter) hydrochloric acid aqueous solution is held in an oven at a set temperature of 120° C. for 12 hours to obtain a dissolution solution. Next, 30 mL of pure water is added to the obtained dissolution solution, which is then filtered using a 0.1 μm membrane filter. Elemental analysis of the filtrate obtained as described above is carried out using a high frequency inductively coupled plasma (ICP) emission spectrometer. Based on the obtained elemental analysis results, a content of each metal atom with respect to 100% by atom of iron atoms is obtained. The composition is checked based on the obtained content.

As the ICP emission spectrometer, for example, ICPS-8100 (model number) manufactured by Shimadzu Corporation can be suitably used. However, the ICP emission spectrometer is not limited thereto.

The crystal phase of the magnetoplumbite-type hexagonal ferrite may be a single phase or may not a single phase; however, in a case where the magnetoplumbite-type hexagonal ferrite is a specific magnetoplumbite-type hexagonal ferrite, the crystal phase is preferably a single phase.

In a case where the content of aluminum is the same, the powder of a specific magnetoplumbite-type hexagonal ferrite in which the crystal phase is a single phase tends to have a high coercive force and more excellent magnetic properties, as compared with the powder of a specific magnetoplumbite-type hexagonal ferrite in which the crystal phase is not a single phase (for example, the crystal phase is double crystal phases).

In the present disclosure, the description "the crystal phase is a single phase" indicates that only one kind of diffraction pattern showing a crystal structure of the magnetoplumbite-type hexagonal ferrite having any composition is observed in powder X-ray diffraction (XRD; the same applies hereinafter) measurement.

On the other hand, in the present disclosure, the description "the crystal phase is not a single phase" indicates that there is such a case where a plurality of magnetoplumbite-type hexagonal ferrites of any composition are mixed, and two or more kinds of diffraction patterns are observed or a crystal diffraction pattern other than that of the magnetoplumbite-type hexagonal ferrite is observed.

In a case where the crystal phase is not a single phase, a diffraction pattern having a main peak and other peaks is obtained. Here, the "main peak" refers to a peak having the highest value of diffraction intensity in the observed diffraction pattern.

In a case where the radio wave absorbing layer contains the magnetoplumbite-type hexagonal ferrite powder as a magnetic powder, a ratio (Is/Im) of a value of the diffraction intensity of the other peak (hereinafter, referred to as "Is") to a value of the diffraction intensity of the main peak (hereinafter, referred to as "Im") obtained by the powder X-ray diffraction (XRD) measurement of the magnetoplumbite-type hexagonal ferrite powder is, for example, preferably ½ or less more preferably ⅕ or less, from the viewpoint that a radio wave absorber having more excellent radio wave absorption performance.

In a case where two or more types of diffraction patterns are overlapped with each other and the peaks of the diffraction patterns have maximal values, the respective maximal values are defined as Im and Is, and the ratio thereof is obtained. In addition, in a case where two or more types of diffraction patterns are overlapped with each other and the other peak is observed as a shoulder of the main peak, the maximum intensity value of the shoulder is defined as Is and the ratio thereof is obtained.

In addition, in a case where there are two or more other peaks, a total value of the respective diffraction intensities is defined as Is, and the ratio thereof is obtained.

Regarding the attribution of the diffraction pattern, for example, a database of the International Centre for Diffraction Data (ICDD: registered trade names) can be referenced.

For example, regarding the diffraction pattern of the magnetoplumbite-type hexagonal ferrite containing Sr, "00-033-1340" of the International Centre for Diffraction Data (ICDD) can be referenced. However, in a case where a part of iron is substituted with aluminum as in the specific magnetoplumbite-type hexagonal ferrite, the peak position shifts.

As described above, the fact that the crystal phase of the magnetoplumbite-type hexagonal ferrite is a single phase is confirmed by the powder X-ray diffraction (XRD) measurement.

Specifically, a powder X-ray diffraction (XRD) apparatus is used, and the measurement is carried out under the following conditions.

As the powder X-ray diffraction (XRD) apparatus, for example, X'Pert Pro (product name) manufactured by PANalytical Co., Ltd. can be suitably used. However, the powder X-ray diffraction (XRD) apparatus is not limited thereto.

—Conditions—

X-ray source: CuKα ray
[Wavelength: 1.54 Å (0.154 nm), output: 40 mA, 45 kV]
Scan range: $20° < 2\theta < 70°$
Scan interval: 0.05°
Scan speed: 0.75°/min The fact that the radio wave absorbing layer contains the magnetoplumbite-type hexagonal ferrite powder can be checked, for example, by the following method.

After the radio wave absorbing layer is finely chopped, it is immersed in a solvent (for example, acetone) for 1 or 2 days, and then dried. The structure can be checked by further finely grinding the dried radio wave absorbing layer and carrying out the powder X-ray diffraction (XRD) measurement.

After cutting out the cross section of the radio wave absorbing layer, the composition can be checked by using, for example, an energy dispersive X-ray analyzer.

The shape of the particle that constitutes the magnetic powder is not particularly limited, and examples thereof include a spherical shape, a rod shape, a needle shape, a flat plate shape, and an irregular shape.

The shape of the particle that constitutes the magnetoplumbite-type hexagonal ferrite powder is, for example, a flat plate shape, an irregular shape, or the like.

The size of the particle that constitutes the magnetic powder is not particularly limited.

In a case where a mode is denoted by a mode diameter, a 10% cumulative diameter is denoted by $D_{10}$, and a 90% cumulative diameter is denoted by $D_{90}$ in a number-based particle size distribution measured by a laser diffraction and scattering method, the magnetic powder (preferably the magnetoplumbite-type hexagonal ferrite powder and more preferably the specific magnetoplumbite-type hexagonal ferrite powder; the same applies hereinafter) is it is preferable that the mode diameter is 5 µm or more and less than 10 µm, and the following is satisfied, $(D_{90}-D_{10})$/mode diameter ≤3.0, it is more preferable that the mode diameter is 5 µm or more and less than 10 µm, and the following is satisfied, $(D_{90}-D_{10})$/mode diameter ≤2.5, it is still more preferable that the mode diameter is 5 µm or more and less than 10 µm, and the following is satisfied, $(D_{90}-D_{10})$/mode diameter ≤2.0, it is particularly preferable that the mode diameter is 5 µm or more and less than 10 µm, and the following is satisfied, $(D_{90}-D_{10})$/mode diameter ≤1.5, and it is most preferable that the mode diameter is 5 µm or more and less than 10 µm, and the following is satisfied, $(D_{90}-D_{10})$/mode diameter ≤1.0.

According to the magnetic powder that has a mode diameter of 5 µm or more and satisfies $(D_{90}-D_{10})$/mode diameter ≤3.0, since there are a relatively small number of fine particles which have inferior magnetic properties, a radio wave absorber having more excellent radio wave absorption performance tend to be produced.

According to the magnetic powder that has a mode diameter of less than 10 µm and satisfies $(D_{90}-D_{10})$/mode diameter ≤3.0, since there are a relatively small number of coarse particles, a radio wave absorber having more excellent strength tend to be produced.

The particle size of the magnetic powder (that is, the mode diameter, $D_{10}$, and $D_{90}$) can be controlled by, for example, classification with a sieve, a centrifuge, or the like, or pulverization with a mortar and pestle, an ultrasonic disperser, or the like. For example, in a case where the particle size of the magnetic powder is controlled by pulverization, the particle size thereof can be adjusted to the target value by selecting the pulverizing unit, the pulverizing time, the medium material, the medium diameter, or the like.

For example, according to the pulverization using a medium, the particle size of the magnetic powder tends to be small. In addition, for example, as the pulverizing time becomes long, the particle size of the magnetic powder tends to be small. Further, for example, as the medium diameter becomes small, the particle size of the magnetic powder tends to be small.

The value of "$(D_{90}-D_{10})$/mode diameter" can be adjusted to the target value, for example, by sorting the particles by classification with a sieve, a centrifuge, or the like after pulverization.

The mode, the 10% cumulative diameter, and the 90% cumulative diameter of the magnetic powder are values determined based on the number-based particle size distribution measured by the laser diffraction and scattering method. Specifically, they are values measured by the following method.

500 mL of cyclohexanone is added to 10 mg of a magnetic powder and diluted, stirred using a shaker for 30 seconds, and the obtained liquid is used as a sample for the particle size distribution measurement. Then, the particle size distribution is measured by the laser diffraction and scattering method using the sample for the particle size distribution measurement. A laser diffraction/scattering-type particle size distribution analyzer is used as the measurement device.

As the laser diffraction/scattering-type particle size distribution analyzer, for example, Partica LA-960 (product name) manufactured by Horiba, Ltd. can be suitably used. However, the laser diffraction/scattering-type particle size distribution analyzer is not limited thereto.

The particle size of the magnetic powder contained in the radio wave absorbing layer can be checked by, for example, the following method.

After a radio wave absorbing layer is finely chopped, it is ultrasonically dispersed in a solvent (for example, acetone). The obtained dispersion liquid is used as a sample, and the particle size of the magnetic powder can be checked by carrying out the measurement with a laser diffraction and scattering method.

The coercive force (Hc) of the magnetic powder is not particularly limited; however, it is, for example, preferably 2.5 kOe or more, more preferably 4.0 kOe or more, and still more preferably 5.0 kOe or more.

In a case where the coercive force (Hc) of the magnetic powder is 2.5 kOe or more, it is possible to produce a radio wave absorber having more excellent radio wave absorption performance.

The upper limit of the coercive force (Hc) of the magnetic powder is not particularly limited; however, it is, for example, preferably 18 kOe or less.

The saturation magnetization (δs) per unit mass of the magnetic powder is not particularly limited; however, it is, for example, preferably 10 emu/g or more, more preferably 20 emu/g or more, and still more preferably 30 emu/g or more.

In a case where the saturation magnetization (δs) per unit mass of the magnetic powder is 10 emu/g or more, it is possible to produce a radio wave absorber having more excellent radio wave absorption performance.

The upper limit of the saturation magnetization (δs) per unit mass of the magnetic powder is not particularly limited; however, it is, for example, preferably 60 emu/g or less.

The coercive force (Hc) and the saturation magnetization (δs) per unit mass of the magnetic powder are values measured using an oscillating sample magnetometer in an environment of an ambient temperature of 23° C. and conditions of a maximum applied magnetic field of 50 kOe and a magnetic field sweep rate of 25 Oe/s (second).

As the oscillating sample magnetometer, for example, TM-TRVSM5050-SMSL (model number) manufactured by TAMAKAWA Co. Ltd. can be suitably used. However, the oscillating sample magnetometer is not limited thereto.

The radio wave absorbing layer may include only one kind of magnetic powder or may include two or more kinds thereof.

The mass-based content of the magnetic powder in the radio wave absorbing layer is not particularly limited as long as the filling rate of the magnetic powder in the radio wave absorbing layer is 35% by volume or less.

~Method of Producing Specific Magnetoplumbite-Type Hexagonal Ferrite Powder~

The method of producing the specific magnetoplumbite-type hexagonal ferrite powder is not particularly limited.

The specific magnetoplumbite-type hexagonal ferrite powder can be produced by either a solid phase method or a liquid phase method.

Examples of the method of producing the specific magnetoplumbite-type hexagonal ferrite powder by the solid phase method include a method in which $SrCO_3$, $Al_2O_3$, $\alpha\text{-}Fe_2O_3$, and the like are used as raw materials. Regarding a general method of producing the specific magnetoplumbite-type hexagonal ferrite powder by the solid phase method, paragraphs [0023] to [0025] of JP4674380B can be appropriately referenced.

The method of producing the specific magnetoplumbite-type hexagonal ferrite powder is preferably a method (hereinafter, referred to as a "producing method A") described below from the viewpoint that it is easy to obtain the specific magnetoplumbite-type hexagonal ferrite powder having excellent magnetic properties.

The producing method A includes a step A of obtaining, by a liquid phase method, a reaction product containing Fe, Al, and at least one kind of metal element (hereinafter, also referred to as a "specific metal element") selected from the group consisting of Sr, Ba, Ca, and Pb, a step B of drying the reaction product obtained in the step A to obtain a dried product, and a step C which is any one of a step (hereinafter, also referred to as a "c1 step") of sintering the dried product obtained in the step B to obtain a sintered product and then pulverizing the obtained sintered product or a step (hereinafter, also referred to as a "c2 step") of pulverizing the dried product obtained in the step B to obtain a pulverized product and then sintering the obtained pulverized product.

The step A, the step B, and the step C may be each divided into two or more stages.

In addition, the producing method A may include a step, as necessary, in addition to the step A, the step B, and the step C.

Hereinafter, each step will be described in detail.

(Step A)

The step A is a step of obtaining, by a liquid phase method, a reaction product containing Fe, Al, and at least one kind of metal element (that is a specific metal element) selected from the group consisting of Sr, Ba, Ca, and Pb.

In the step A, it is possible to obtain a reaction product that serves as a precursor of the specific magnetoplumbite-type hexagonal ferrite powder. It is presumed that the reaction product obtained in the step A is iron hydroxide, aluminum hydroxide, a composite hydroxide of iron, aluminum, and the specific metal element, and the like.

The step A preferably includes a step (hereinafter, also referred to as a "step A1") of mixing an aqueous solution (hereinafter, also referred to as a "raw material aqueous solution") containing an Fe salt, an Al salt, and a salt of the specific metal element with an alkaline aqueous solution to obtain a reaction product.

In the step A1, the reaction product is mixed with the raw material aqueous solution, whereby a precipitate of the alkaline aqueous solution is generated. In the step A1, it is possible to obtain a solution containing a reaction product (a so-called precursor-containing solution) that serves as a precursor of the specific magnetoplumbite-type hexagonal ferrite powder.

Further, the step A preferably includes a step (hereinafter, also referred to as a "step A2") of carrying out the solid-liquid separation of the reaction product obtained in the step A1.

In the step A2, it is possible to obtain a reaction product (that is, the reaction product in the step A) that serves as a precursor of the specific magnetoplumbite-type hexagonal ferrite powder.

—Step A1—

The step A1 is a step of mixing an aqueous solution (that is, the raw material aqueous solution) containing an Fe salt, an Al salt, and a salt of the specific metal element with an alkaline aqueous solution to obtain a reaction product.

The salt as the Fe salt, the Al salt, and the salt of the specific metal element is not particularly limited, and it is, for example, preferably a water-soluble inorganic acid salt such as nitrate, sulfate, or chloride from the viewpoint of availability and cost.

Specific examples of the Fe salt include iron (III) chloride hexahydrate [$FeCl_3 \cdot 6H_2O$] and iron (III) nitrate nonahydrate [$Fe(NO_3)_3 \cdot 9H_2O$].

Specific examples of the Al salts include aluminum chloride hexahydrate [$AlCl_3 \cdot 6H_2O$] and aluminum nitrate nonahydrate [$Al(NO_3)_3 \cdot 9H_2O$].

Specific examples of the Sr salt include strontium chloride hexahydrate [$SrCl_2 \cdot 6H_2O$], strontium nitrate [$Sr(NO_3)_2$], and strontium acetate 0.5 hydrate [$Sr(CH_3COO)_2 \cdot 0.5H_2O$].

Specific examples of the Ba salt include barium chloride dihydrate [$BaCl_2 \cdot 2H_2O$], barium nitrate [$Ba(NO_3)_2$], and barium acetate [$(CH_3COO)_2Ba$].

Specific examples of the Ca salt include calcium chloride dihydrate [$CaCl_2 \cdot 2H_2O$], calcium nitrate tetrahydrate [$Ca(NO_3)_2 \cdot 4H_2O$], and calcium acetate monohydrate [$(CH_3COO)_2Ca \cdot H_2O$].

Specific examples of the Pb salt include lead (II) chloride [$PbCl_2$] and lead (II) nitrate [$Pb(NO_3)_2$].

The alkaline aqueous solution is not particularly limited, and examples thereof include a sodium hydroxide aqueous solution and a potassium hydroxide aqueous solution.

The concentration of the alkaline aqueous solution is not particularly limited, and it can be, for example, 0.1 mol/L to 10 mol/L.

The raw material aqueous solution and the alkaline aqueous solution may be simply mixed.

The whole amount of the raw material aqueous solution and the whole amount of the alkaline aqueous solution may be mixed at one time, or the raw material aqueous solution and the alkaline aqueous solution may be gradually mixed little by little. Alternatively, the mixing may be carried out by mixing while adding one of the raw material aqueous solution and the alkaline aqueous solution to the other little by little.

For example, from the viewpoint of reproducibility of the radio wave absorption performance, it is preferable to gradually mix the raw material aqueous solution with the alkaline aqueous solution little by little.

The method of mixing the raw material aqueous solution with the alkaline aqueous solution is not particularly limited, and examples thereof include a method of mixing with stirring.

A stirring unit is not particularly limited, and a general stirring instrument or stirring device can be used.

The stirring time is not particularly limited as long as the reaction of the components to be mixed is completed, and it can be appropriately set depending on the composition of the raw material aqueous solution, the kind of the stirring instrument or stirring device, and the like.

The temperature at which the raw material aqueous solution is mixed with the alkaline aqueous solution is, for example, preferably 100° C. or lower from the viewpoint of preventing explosive boil, and more preferably 95° C. or lower and still more preferably 15° C. or higher and 92° C. or lower from the viewpoint of obtaining a good reaction product.

The unit for adjusting the temperature is not particularly limited, and a general heating device, cooling device, or the like can be used.

The pH, at 25° C., of the aqueous solution obtained by mixing the raw material aqueous solution with the alkaline aqueous solution is, for example, preferably 5 to 13 and more preferably 6 to 12 from the viewpoint that a reaction product is more easily obtained.

The mixing ratio between the raw material aqueous solution and the alkaline aqueous solution is not particularly limited, and for example, the alkaline aqueous solution can be set to 0.1 part by mass to 10.0 parts by mass with respect to 1 part by mass of the raw material aqueous solution.

—Step A2—

The step A2 is a step of carrying out the solid-liquid separation of the reaction product obtained in the step A1.

The method of solid-liquid separation is not particularly limited, and examples thereof include methods such as decantation, centrifugation, and filtration (suction filtration, pressure filtration, or the like).

In a case where the method of solid-liquid separation is centrifugation, the conditions for the centrifugation are not particularly limited. For example, it is preferable to carry out centrifugation at a rotation speed of 2,000 revolutions (rpm; the same applies hereinafter) per minute or more for 3 to 30 minutes. Further, the centrifugation may be carried out a plurality of times.

(Step B)

The step B is a step of drying the reaction product obtained in the step A to obtain a dried product (a so-called precursor powder).

In a case where the reaction product obtained in the step A is dried before sintering, the reproducibility of the radio wave absorption performance of the produced radio wave absorber is improved. In addition, in a case where the reaction product obtained in the step A is dried before pulverization, it is easy to control the particle size distribution of the specific magnetoplumbite-type hexagonal ferrite powder, by pulverization.

The drying unit is not particularly limited, and examples thereof include a dryer such as an oven.

The drying temperature is not particularly limited; however, it is, for example, preferably 50° C. to 200° C. and more preferably 70° C. to 150° C.

The drying time is not particularly limited; however, it is, for example, preferably 2 hours to 50 hours and more preferably 5 hours to 30 hours.

(Step C)

The step C is any one of a step (that is, the c1 step) of sintering the dried product obtained in the step B to obtain a sintered product and then pulverizing the obtained sintered product or a step (that is, the c2 step) of pulverizing the dried product obtained in the step B to obtain a pulverized product and then sintering the obtained pulverized product.

The specific magnetoplumbite-type hexagonal ferrite powder having a targeted particle size can be obtained by obtaining a sintered product by sintering the dried product obtained in the step B and pulverizing the obtained sintered product or obtaining a pulverized product by pulverizing the dried product obtained in the step B and sintering the obtained pulverized product.

The step C may be the c1 step or the c2 step.

For example, from the viewpoint of making the magnetic properties after sintering more uniform, the step C is preferably the step c2.

Here, in a case where the step C is the c2 step, the sintered and pulverized product may be further pulverized.

The sintering can be carried out using a heating device.

The heating device is not particularly limited as long as it can heat to a targeted temperature, and any well known heating device can be used. As the heating device, for example, in addition to an electric furnace, a sintering device uniquely prepared according to a production line can be used.

The sintering is preferably carried out in an ambient air atmosphere.

The sintering temperature is not particularly limited; however, it is, for example, preferably 900° C. or higher, more preferably 900° C. to 1,400° C., and still more preferably 1,000° C. to 1,200° C.

The sintering time is not particularly limited; however, it is, for example, preferably 1 hour to 10 hours and more preferably 2 hours to 6 hours.

The pulverizing unit is not particularly limited, as long as the specific magnetoplumbite-type hexagonal ferrite powder having a targeted particle size can be obtained.

Examples of the pulverizing unit include a mortar and pestle and a pulverizer (a cutter mill, a ball mill, a bead mill, a roller mill, a jet mill, a hammer mill, an attritor, or the like).

In the case of pulverizing using a medium, a particle size of the medium (a so-called medium diameter) is not particularly limited; however, it is, for example, preferably 0.1 mm to 5.0 mm and more preferably 0.5 mm to 3.0 mm.

In the present disclosure, in a case of a spherical medium (for example, spherical beads), the "medium diameter" means a diameter of a medium (for example, beads), and in a case of a non-spherical medium (for example, non-spherical beads), the "medium diameter" means a diameter obtained by measuring a circle equivalent diameter of a plurality of medium (for example, beads) from an observation image of a transmission electron microscope (TEM) or a scanning electron microscope (SEM) and arithmetically averaging the measured values.

The medium material is not particularly limited, and for example, a medium formed of glass, alumina, steel, zirconia, ceramic, or the like can be suitably used.

<Binder>

The radio wave absorbing layer contains a binder.

Examples of the binder include a thermoplastic resin and a thermosetting resin.

Examples of the thermoplastic resin include an acrylic resin; polyacetal; polyamide; polyethylene; polypropylene; polyethylene terephthalate; polybutylene terephthalate; polycarbonate; polystyrene; polyphenylene sulfide; polyvinyl chloride; an acrylonitrile butadiene styrene (ABS) resin obtained by copolymerization of acrylonitrile, butadiene, and styrene; and an acrylonitrile styrene (AS) resin obtained by copolymerization of acrylonitrile and styrene.

Examples of the thermosetting resin include a phenol resin, an epoxy resin, a melamine resin, a urea resin, an unsaturated polyester, a diallyl phthalate resin, a urethane resin, and a silicon resin.

Examples of the binder include rubber.

From viewpoints that the mixability with the magnetic powder is good and the radio wave absorber having more excellent durability, weather fastness, and impact resistance can be produced, the rubber is preferably butadiene rubber; isoprene rubber; chloroprene rubber; halogenated butyl rubber; fluororubber; urethane rubber; acrylic rubber (ACM) obtained by copolymerization of an acrylic acid ester (for example, ethyl acrylate, butyl acrylate, and 2-ethylhexyl acrylate) and other monomers; ethylene-propylene rubber obtained by coordination polymerization of ethylene and propylene using a Ziegler catalyst; butyl rubber (IIR) obtained by copolymerization of isobutylene and isoprene; styrene butadiene rubber (SBR) obtained by copolymerization of butadiene and styrene; acrylonitrile butadiene rubber (NBR) obtained by copolymerization of acrylonitrile and butadiene; and silicone rubber.

Examples of the binder include a thermoplastic elastomer (TPE).

Examples of the thermoplastic elastomer include an olefin-based thermoplastic elastomer (TPO), a styrene-based thermoplastic elastomer (TPS), an amide-based thermoplastic elastomer (TPA), and a polyester-based thermoplastic elastomer (TPC).

In a case where the radio wave absorbing layer contains rubber as the binder, it may contain various additives such as a vulcanizing agent, a vulcanization aid, a softener, and a plasticizer, in addition to the rubber.

Examples of the vulcanizing agent include sulfur, an organic sulfur chemical compound, and a metal oxide.

The melt mass flow rate (hereinafter, also referred to as "MFR") of the binder is not particularly limited; however, it is, for example, preferably 1 g/10 min to 200 g/10 min, more preferably 3 g/10 min to 100 g/10 min, still more preferably 5 g/10 min to 80 g/10 min, and particularly preferably 10 g/10 min to 50 g/10 min.

In a case where the MFR of the binder is 1 g/10 min or more, fluidity is sufficiently high and the poor appearance is less likely to occur.

In a case where the MFR of the binder is 200 g/10 min or less, mechanical properties such as the hardness of a molded body are more easily enhanced.

The MFR of the binder is a value measured under the conditions of a measurement temperature of 230° C. and a load of 10 kg according to JIS K 7210:1999.

The hardness of the binder is not particularly limited; however, it is, for example, preferably 5 g to 150 g, more preferably 10 g to 120 g, still more preferably 30 g to 100 g, and particularly preferably 40 g to 90 g, from the viewpoint of moldability.

The hardness of the binder is an instantaneous value measured according to JIS K 6253-3:2012.

The density of the binder is not particularly limited; however, it is, for example, preferably 600 kg/m$^3$ to 1,100 kg/m$^3$, more preferably 700 kg/m$^3$ to 1,000 kg/m$^3$, still more preferably 750 kg/m$^3$ to 1,050 kg/m$^3$, and particularly preferably 800 kg/m$^3$ to 950 kg/m$^3$, from the viewpoint of moldability.

The density of the binder is a value measured according to JIS K 0061:2001.

The 100% tensile stress of the binder is not particularly limited; however, it is, for example, preferably 0.2 MPa to 20 MPa, more preferably 0.5 MPa to 10 MPa, still more preferably 1 MPa to 5 MPa, and particularly preferably 1.5 MPa to 3 MPa, from the viewpoint of moldability.

The tensile strength of the binder is not particularly limited; however, it is, for example, preferably 1 MPa to 20 MPa, more preferably 2 MPa to 15 MPa, still more preferably 3 MPa to 10 MPa, and particularly preferably 5 MPa to 8 MPa, from the viewpoint of moldability.

The elongation at the time of cutting of the binder is not particularly limited; however, it is, for example, preferably 110% to 1,500%, more preferably 150% to 1,000%, still more preferably 200% to 900%, and particularly preferably 400% to 800%, from the viewpoint of moldability.

The tensile properties described above are values measured according to JIS K 6251:2010. The measurement is carried out using a JIS No. 3 dumbbell as a test piece under the condition of a pulling speed of 500 mm/min.

The radio wave absorbing layer may include only one kind of binder and may include two or more kinds thereof.

The filling rate of the binder in the radio wave absorbing layer is not particularly limited; however, it is, for example, preferably 65% by volume or more, more preferably 65% by volume or more and 92% by volume or less, and still more preferably 65% by volume or more and 85% by volume or less.

<Other Additives>

The radio wave absorbing layer may contain various additives (so-called other additives) as necessary, in addition to the magnetic powder and the binder, as long as the effects of the radio wave absorber of the present disclosure are not impaired.

Examples of the other additives include a dispersing agent, a dispersing aid, a fungicide, an antistatic agent, and an antioxidant. One component of the other additives may carry out two or more functions.

[Method of Producing Radio Wave Absorber]

The method of producing the radio wave absorber of the present disclosure is not particularly limited.

The radio wave absorber of the present disclosure can be produced by a well known method using a magnetic powder, a binder, and, as necessary, a solvent, other additives, and the like.

The radio wave absorber of the present disclosure can be produced by, for example, the following method X.

A mixture containing a magnetic powder, a binder, and, as necessary, other additives is kneaded using a kneader, while heating, to obtain a compound. Next, the obtained compound is subjected to molding processing, whereby a radio wave absorber consisting of a radio wave absorbing layer can be produced.

Since the magnetic powder in the method X has the same meaning as the magnetic powder described in the section of "Radio wave absorber", and the preferred aspect is also the same, the description thereof is omitted here.

The content of the magnetic powder in the mixture may be adjusted so that the filling rate of the magnetic powder in the finally obtained radio wave absorbing layer is 35% by volume or less.

Since the binder in the method X has the same meaning as the binder described in the section of "Radio wave absorber", and the preferred aspect is also the same, the description thereof is omitted here.

The content of the binder in the mixture is not particularly limited; however, the content of the binder is preferably adjusted, for example, so that the filling rate of the binder in the finally obtained radio wave absorbing layer is to be the filling rate of the binder in the above-described radio wave absorbing layer.

Since the other additives in the method X has the same meaning as the other additives described in the section of "Radio wave absorber", and the preferred aspect is also the same, the description thereof is omitted here.

In the mixture, the magnetic powder needs only to be mixed with the binder.

The method of mixing the magnetic powder with the binder is not particularly limited, and examples thereof include a method of mixing by stirring.

A stirring unit is not particularly limited, and a general stirring device can be used.

Examples of the stirring device include mixers such as a paddle mixer and an impeller mixer.

The stirring time is not particularly limited, and it can be appropriately set depending on, for example, the kind of the stirring device and the composition of the mixture.

The heating temperature of the mixture is not particularly limited and can be appropriately set depending on, for example, the kind of the binder.

The heating temperature is preferably a temperature at which the binder can be melted, and it can be, for example, 170° C. to 300° C.

A kneading unit is not particularly limited, and a general kneading device can be used.

Examples of the kneading device include devices such as a mixer, a double roll, and a kneader.

The kneading conditions are not particularly limited and can be appropriately set depending on, for example, the kind of the kneading device and the composition of the mixture.

Examples of the molding processing include processing by press molding, extrusion molding, injection molding, in-mold forming, and molding using a three-dimensional molding machine.

The molding processing conditions are not particularly limited and can be appropriately set depending on, for example, the kind of the molding processing device, the composition of the mixture, and the thickness of the radio wave absorbing layer.

The thickness of the radio wave absorbing layer is not particularly limited as long as the following relationship is satisfied, $0.65 \leq (P/100) \times Q$, where the filling rate of the magnetic powder in the radio wave absorbing layer is denoted by $P$ % by volume and a thickness of the radio wave absorbing layer is denoted by $Q$ mm.

The thickness of the radio wave absorbing layer can be adjusted, for example, by the molding processing of the compound.

Further, the radio wave absorber of the present disclosure can be produced by, for example, the following method Y.

A composition for forming a radio wave absorbing layer, containing a magnetic powder, a binder, and, as necessary, a solvent, other additives, and the like is applied onto a temporary support to form a coating film of the composition for forming a radio wave absorbing layer. Next, the coating film of the composition for forming a radio wave absorbing layer is dried, whereby a radio wave absorbing layer is formed. Next, the temporary support is peeled off from the radio wave absorbing layer, whereby a radio wave absorber consisting of the radio wave absorbing layer can be produced.

Since the magnetic powder in the method Y has the same meaning as the magnetic powder described in the section of "Radio wave absorber", and the preferred aspect is also the same, the description thereof is omitted here.

The content of the magnetic powder in the composition for forming a radio wave absorbing layer may be adjusted so that the filling rate of the magnetic powder in the finally obtained radio wave absorbing layer is 35% by volume or less.

Since the binder in the method Y has the same meaning as the binder described in the section of "Radio wave absorber", and the preferred aspect is also the same, the description thereof is omitted here.

The content of the binder in the composition for forming a radio wave absorbing layer is not particularly limited; however, the content of the binder is preferably adjusted, for example, so that the filling rate of the binder in the finally obtained radio wave absorbing layer is to be the filling rate of the binder in the above-described radio wave absorbing layer.

The solvent in the method Y is not particularly limited, and examples thereof include water, an organic solvent, and a mixed solvent of water and an organic solvent.

Examples of the organic solvent include alcohols such as methanol, ethanol, n-propanol, i-propanol, and methoxypropanol, ketones such as acetone, methyl ethyl ketone, cyclohexane, and cyclohexanone, tetrahydrofuran, acetonitrile, ethyl acetate, and toluene.

In a case where the composition for forming a radio wave absorbing layer includes a solvent, the content of the solvent in the composition for forming a radio wave absorbing layer is not particularly limited, and it can be appropriately set, for example, depending on the kind or amount of the components blended in the composition for forming a radio wave absorbing layer.

Since the other additives in the method Y has the same meaning as the other additives described in the section of "Radio wave absorber", and the preferred aspect is also the same, the description thereof is omitted here.

In the composition for forming a radio wave absorbing layer, the magnetic powder needs only to be mixed with the binder.

The method of mixing the magnetic powder with the binder is not particularly limited, and examples thereof include a method of mixing by stirring.

A stirring unit is not particularly limited, and a general stirring device can be used.

Examples of the stirring device include mixers such as a paddle mixer and an impeller mixer.

The stirring time is not particularly limited, and it can be appropriately set depending on, for example, the kind of the stirring device and the composition of a composition for forming a radio wave absorbing layer.

The temporary support is not particularly limited.

Examples of the temporary support include a metal plate (a plate of metal such as aluminum, zinc, or copper), a glass plate, and a plastic sheet [a sheet of polyester (polyethylene terephthalate, polyethylene naphthalate, or polybutylene terephthalate), polyethylene (linear low-density polyethylene, low-density polyethylene, or high-density polyethylene), polypropylene, polystyrene, polycarbonate, polyimide, polyamide, polyamide imide, polysulfone, polyvinyl chloride, polyacrylonitrile, polyphenylene sulfide, polyether imide, polyether sulfone, polyvinyl acetal, or an acrylic resin].

It is preferable that the surface of the plastic sheet is subjected to a mold release treatment.

The size of the temporary support is not particularly limited, and it can be appropriately set depending on, for example, the size of the radio wave absorbing layer.

The thickness of the temporary support is not particularly limited, and it is generally approximately 0.01 mm to 0.5 mm and is, for example, preferably 0.05 mm to 0.2 mm from the viewpoint of workability.

The method of applying the composition for forming a radio wave absorbing layer on a temporary support is not particularly limited, and examples thereof include methods using a die coater, a knife coater, an applicator, and the like.

The method of drying the coating film of the composition for forming a radio wave absorbing layer is not particularly limited, and examples thereof include a method using a heating device such as an oven.

The drying temperature and drying time are not particularly limited as long as the solvent contained in the coating film of the composition for forming a radio wave absorbing layer can be volatilized.

For example, heating is carried out at 70° C. to 90° C. for 1 hour to 3 hours.

The thickness of the radio wave absorbing layer is not particularly limited as long as the following relationship is satisfied, $0.65 \leq (P/100) \times Q$, where the filling rate of the magnetic powder in the radio wave absorbing layer is denoted by P % by volume and a thickness of the radio wave absorbing layer is denoted by Q mm.

The thickness of the radio wave absorbing layer can be adjusted with, for example, the coating amount of the composition for forming a radio wave absorbing layer.

[Compound]

The compound of the present disclosure is a compound that is used for producing the radio wave absorber of the present disclosure, the compound containing a magnetic powder and a binder, where the filling rate of the magnetic powder is 35% by volume or less.

Since the magnetic powder in the compound of the present disclosure has the same meaning as the magnetic powder described in the section of "Radio wave absorber", and the preferred aspect is also the same, the description thereof is omitted here.

The filling rate of the magnetic powder in the compound of the present disclosure is 35% by volume or less, preferably 8% by volume or more and 35% by volume or less, more preferably 15% by volume or more and 35% by volume or less, and still more preferably 20% by volume or more and 35% by volume or less.

The filling rate of the magnetic powder in the compound of the present disclosure is a value measured by the following method.

A radio wave absorbing layer is prepared using the compound of the present disclosure. Using the prepared radio wave absorbing layer, the measurement is carried out by the same method as that of the filling rate of the magnetic powder in the radio wave absorbing layer described in the section of "Radio wave absorber".

Since the binder in the compound of the present disclosure has the same meaning as the binder described in the section of "Radio wave absorber", and the preferred aspect is also the same, the description thereof is omitted here.

The filling rate of the binder in the compound of the present disclosure is not particularly limited; however, it is, for example, preferably 65% by volume or more, more preferably 65% by volume or more and 92% by volume or less, and still more preferably 65% by volume or more and 85% by volume or less.

The compound of the present disclosure may have a pellet shape.

The size (the diameter) of the compound having a pellet shape is not particularly limited; however, it is, for example, preferably 0.5 mm to 20 mm, more preferably 1 mm to 10 mm, still more preferably 2 mm to 8 mm, and particularly preferably 3 mm to 6 mm.

The density of the compound having a pellet shape is not particularly limited; however, it is, for example, preferably 500 kg/m$^3$ to 5,000 kg/m$^3$, more preferably 800 kg/m$^3$ to 4,000 kg/m$^3$, still more preferably 1,000 kg/m$^3$ to 3,500 kg/m$^3$, and particularly preferably 1,200 kg/m$^3$ to 3,000 kg/m$^3$.

The density of the compound is a value measured according to JIS K 0061:2001.

The compound of the present disclosure may contain various additives (so-called other additives), as necessary, in addition to the magnetic powder and the binder.

Since the other additives in the compound of the present disclosure has the same meaning as the other additives described in the section of "Radio wave absorber", and the preferred aspect is also the same, the description thereof is omitted here.

EXAMPLES

Hereinafter, the present invention will be described in more detail with reference to examples, but the present invention is not limited to the following examples, as long as the gist of the present invention is not exceeded.

[Production of Magnetic Powder]

[Magnetic Powder 1]

A total amount of a raw material aqueous solution prepared by dissolving 57.0 g of iron (III) chloride hexahydrate [$FeCl_3 \cdot 6H_2O$], 27.8 g of strontium chloride hexahydrate [$SrCl_2 \cdot 6H_2O$], and 10.2 g of aluminum chloride hexahydrate [$AlCl_3 \cdot 6H_2O$] in 216.0 g of water, and a total amount of a solution prepared by adding 113.0 g of water to 181.3 g of a 5 mol/L sodium hydroxide aqueous solution were added to 400.0 g of water kept at 35° C. and stirred, respectively, at a flow rate of 10 mL/min and the same timing, to obtain a first solution.

Next, after changing the temperature of the first solution to 25° C., 39.8 g of a 1 mol/L sodium hydroxide aqueous solution was added while maintaining the temperature to obtain a second solution. The pH of the second solution was 10.5. The pH of the second solution was measured using a desktop pH meter # F-71 (product name) manufactured by Horiba, Ltd. (the same applies hereinafter).

Next, the second solution was stirred for 15 minutes to complete the reaction, and a solution containing a reaction product which is a precursor of the magnetoplumbite-type hexagonal ferrite powder (that is, a precursor-containing solution) was obtained.

Next, the precursor-containing solution was subjected to the centrifugal separation treatment (rotation speed: 3,000 rpm, rotation time: 10 minutes] three times, and the obtained precipitate was collected.

Next, the collected precipitate was dried in an oven at an internal ambient temperature of 95° C. for 12 hours to obtain an aggregate of particles consisting of the precursor (that is, precursor powder).

Next, the precursor powder was put in a muffle furnace, and the temperature in the furnace was set to a temperature condition of 1,100° C. in an ambient air atmosphere, followed by sintering for 4 hours, thereby obtaining a sintered product.

Next, the obtained sintered product was pulverized for 90 seconds using Wonder Crusher WC-3 (product name) manufactured by Osaka Chemical Co., Ltd., with the variable speed dial being set to "5", thereby obtaining a magnetic powder 1.

[Magnetic Powder 2]

A total amount of a raw material aqueous solution prepared by dissolving 57.0 g of iron (III) chloride hexahydrate [$FeCl_3 \cdot 6H_2O$], 27.8 g of strontium chloride hexahydrate [$SrCl_2 \cdot 6H_2O$], and 10.2 g of aluminum chloride hexahydrate [$AlCl_3 \cdot 6H_2O$] in 216.0 g of water, and a total amount of a solution prepared by adding 113.0 g of water to 181.3 g of a 5 mol/L sodium hydroxide aqueous solution were added to 400.0 g of water kept at 35° C. and stirred, respectively, at a flow rate of 10 mL/min and the same timing, to obtain a first solution.

Next, after changing the temperature of the first solution to 25° C., 30.2 g of a 1 mol/L sodium hydroxide aqueous solution was added while maintaining the temperature to obtain a second solution. As a result of measuring the pH of the obtained second solution, the pH was 9.5.

Next, the second solution was stirred for 15 minutes to complete the reaction, and a solution containing a reaction product which is a precursor of the magnetoplumbite-type hexagonal ferrite powder (that is, a precursor-containing solution) was obtained.

Next, the precursor-containing solution was subjected to the centrifugal separation treatment (rotation speed: 3,000 rpm, rotation time: 10 minutes] three times, and the obtained precipitate was collected.

Next, the collected precipitate was dried in an oven at an internal ambient temperature of 95° C. for 12 hours to obtain an aggregate of particles consisting of the precursor (that is, precursor powder).

Next, the precursor powder was put in a muffle furnace, and the temperature in the furnace was set to a temperature condition of 1,100° C. in an ambient air atmosphere, followed by sintering for 4 hours, thereby obtaining a sintered product.

Next, the obtained sintered product was pulverized for 60 seconds using Wonder Crusher WC-3 (product name) manufactured by Osaka Chemical Co., Ltd., with the variable speed dial being set to "5", thereby obtaining a magnetic powder 2.

<Checking of Crystal Structure>

The crystal structure of the magnetic material forming each of the magnetic powders of the magnetic powder 1 and the magnetic powder 2 (hereinafter, also respectively referred to as the "magnetic material 1 and the magnetic material 2") was checked by the X-ray diffraction (XRD) method.

Specifically, it was checked whether the magnetic material had a magnetoplumbite-type crystal structure and whether the crystal phase was a single phase or two or more different crystal phases.

As the measurement device, X'Pert Pro (product name) manufactured by PANalytical Co., Ltd., which is a powder X-ray diffractometer, was used. The measurement conditions are shown below.

—Measurement Conditions—

X-ray source: CuKα ray
[Wavelength: 1.54 Å (0.154 nm), output: 40 mA, 45 kV]
Scan range: $20° < 2\theta < 70°$
Scan interval: 0.05°
Scan speed: 0.75°/min As a result of the above, it was confirmed that both the magnetic material 1 and the magnetic material 2 have a magnetoplumbite-type crystal structure and that the magnetoplumbite-type crystal structure is a single-phase magnetoplumbite-type hexagonal ferrite that does not include a crystal structure other than the magnetoplumbite-type crystal structure.

<Checking of Composition>

The composition of each of the magnetic material 1 and the magnetic material 2 was checked by the high frequency inductively coupled plasma (ICP) emission spectroscopy.

Specifically, the checking was carried out by the following method.

A beaker (a pressure-resistant container) containing 12 mg of the magnetic powder and 10 mL of a 4 mol/L hydrochloric acid aqueous solution was held in an oven at a set temperature of 120° C. for 12 hours to obtain a dissolution solution. 30 mL of pure water was added to the obtained dissolution solution, which is then filtered using a 0.1 μm membrane filter. Elemental analysis of the filtrate obtained as described above was carried out using a high frequency inductively coupled plasma (ICP) emission spectrometer [model number: ICPS-8100, Shimadzu Corporation].

Based on the obtained elemental analysis results, a content of each metal atom with respect to 100% by atom of iron atoms was obtained. Then, based on the obtained content, the composition of the magnetic material was checked. The composition of each magnetic material is shown below.

Magnetic material 1: $SrFe_{(10.00)}Al_{(2.00)}O_{19}$
Magnetic material 2: $SrFe_{(9.70)}Al_{(2.30)}O_{19}$ As a result of the above, it was confirmed that both the magnetic powder 1 and the magnetic powder 2 are a powder of a magnetoplumbite-type hexagonal ferrite (that is, a specific magnetoplumbite-type hexagonal ferrite powder) represented by Formula (1).

<Measurement of Particle Size Distribution>

The number-based particle size distribution of the magnetic powder of each of the magnetic powder 1 and the magnetic powder 2 was measured by the laser diffraction and scattering method, and the mode (the so-called mode diameter), the 10% cumulative diameter, and the 90% cumulative diameter were determined.

Specifically, 500 mL of cyclohexanone was added to 10 mg of the magnetic powder and diluted, stirred using a shaker for 30 seconds, and the obtained liquid was used as a sample for the particle size distribution measurement.

Next, the particle size distribution of the sample for the particle size distribution measurement was measured using a laser diffraction/scattering-type particle size distribution analyzer [product name: Partica LA-960, manufactured by Horiba, Ltd.].

Then, based on the obtained number-based particle size distribution, the mode diameter (unit: μm) which is the mode, $D_{10}$ (unit: μm) which is the 10% cumulative diameter, and $D_{90}$ (unit: μm) which is the 90% cumulative diameter was determined. In addition, the value of "$(D_{90}-D_{10})$/mode diameter" was calculated.

As a result of the above, the magnetic powder 1 had a mode diameter of 6.7 μm, $D_{10}$ of 4.1 μm, $D_{90}$ of 9.5 μm, and a value of "$(D_{90}-D_{10})$/mode diameter" of 0.81. In addition, the magnetic powder 2 had a mode diameter of 8.8 μm, $D_{10}$ of 5.5 μm, $D_{90}$ of 12.5 μm, and a value of "$(D_{90}-D_{10})$/mode diameter" of 0.80.

<Measurement of Magnetic Properties>

The coercive force (Hc) and the saturation magnetization (δs) of each of the magnetic powders of the magnetic powder 1 and the magnetic powder 2 were measured as magnetic properties.

Specifically, the measurement was carried out by the following method.

As the measurement device, an oscillating sample magnetometer [model number: TM-TRVSM5050-SMSL, TAMAKAWA Co. Ltd.] was used as the device in an environment of an ambient temperature of 23° C. and under the conditions of a maximum applied magnetic field of 50 kOe, and a magnetic field sweep rate of 25 Oe/s (second), and the intensity of magnetization of the magnetic powder with respect to the applied magnetic field was measured. From the measurement results, a magnetic field (H)–magnetization (M) curve of the magnetic powder was obtained. Based on the obtained magnetic field (H)–magnetization (M) curve, the coercive force (Hc) (unit: kOe) and the saturation magnetization (δs) (unit: emu/g) of the magnetic powder were determined.

As a result of the above, the magnetic powder 1 had a coercive force (Hc) of 10.5 kOe and a saturation magnetization (δs) of 43.2 emu/g. In addition, the magnetic powder 2 had a coercive force (Hc) of 10.0 kOe and a saturation magnetization (δs) of 40.2 emu/g.

Production of Radio Wave Absorber (1)

Example 1

1. Production of Compound

A compound was prepared using the magnetic powder 1 and a binder [trade name: MILASTOMER (registered trade name) 7030NS, an olefin-based thermoplastic elastomer (TPO), Mitsui Chemicals, Inc.]. Specifically, it was prepared as follows.

The magnetic powder 1 and the above binder were mixed to obtain a mixture. The blending amount of the magnetic powder 1 and the binder was set so that the filling rate of the magnetic powder 1 in the finally obtained compound was 15% by volume. Next, the obtained mixture was kneaded for 20 minutes using a Labo Plastomill [product name, Toyo Seiki Seisaku-sho, Ltd.] at a set temperature of 200° C. and a rotation speed of 50 rpm to obtain a compound.

2. Production of Radio Wave Absorber

The obtained compound was molded using a heating press device under the conditions of a molding pressure of 20 MPa, a press temperature of 200° C., and a press time of 10 minutes to obtain a sheet-shaped radio wave absorber (size: 100 mm×100 mm). The using amount of the compound was such that the thickness of the finally obtained radio wave absorber was 4.5 mm.

Example 2

The same operation as in Example 1 was carried out to obtain a sheet-shaped radio wave absorber (size: 100 mm×100 mm), except that the blending amount of the magnetic powder 1 and the above binder was changed to an amount such that the filling rate of the magnetic powder 1 in the finally obtained compound was 30% by volume and the using amount of the compound was changed to an amount such that the thickness of the finally obtained radio wave absorber was 3 mm.

Comparative Example 1

The same operation as in Example 1 was carried out to obtain a sheet-shaped radio wave absorber (size: 100 mm×100 mm), except that the using amount of the compound was changed to an amount such that the thickness of the finally obtained radio wave absorber was 3 mm.

Comparative Example 2

The same operation as in Example 1 was carried out to obtain a sheet-shaped radio wave absorber (size: 100 mm×100 mm), except that the blending amount of the magnetic powder 1 and the above binder was changed to an amount such that the filling rate of the magnetic powder 1 in the finally obtained compound was 30% by volume and the using amount of the compound was changed to an amount such that the thickness of the finally obtained radio wave absorber was 2 mm.

Comparative Example 3

The same operation as in Example 1 was carried out to obtain a sheet-shaped radio wave absorber (size: 100 mm×100 mm), except that the blending amount of the magnetic powder 1 and the above binder was changed to an amount such that the filling rate of the magnetic powder 1 in the finally obtained compound was 40% by volume and the using amount of the compound was changed to an amount such that the thickness of the finally obtained radio wave absorber was 2 mm.

Comparative Example 4

The same operation as in Example 1 was carried out to obtain a sheet-shaped radio wave absorber (size: 100 mm×100 mm), except that the blending amount of the magnetic powder 1 and the above binder was changed to an amount such that the filling rate of the magnetic powder 1 in the finally obtained compound was 40% by volume and the using amount of the compound was changed to an amount such that the thickness of the finally obtained radio wave absorber was 3 mm.

Comparative Example 5

The same operation as in Example 1 was carried out to obtain a sheet-shaped radio wave absorber (size: 100 mm×100 mm), except that the blending amount of the magnetic powder 1 and the above binder was changed to an amount such that the filling rate of the magnetic powder 1 in the finally obtained compound was 50% by volume and the using amount of the compound was changed to an amount such that the thickness of the finally obtained radio wave absorber was 2 mm.

"The filling rate of the magnetic powder in the radio wave absorbing layer (unit: % by volume)", "the thickness of the radio wave absorbing layer (unit: mm)", and "(P/100)×Q" in the radio wave absorber of each of Example 1, Example 2, and Comparative Example 1 to Comparative Example 5 are shown in Table 1.

Production of Radio Wave Absorber (2)

Example 3

1. Production of Compound

A compound was prepared using the magnetic powder 2 and a binder [trade name: MILASTOMER (registered trade name) 7030NS, an olefin-based thermoplastic elastomer (TPO), Mitsui Chemicals, Inc.]. Specifically, it was prepared as follows.

The magnetic powder 2 and the above binder were mixed to obtain a mixture. The blending amount of the magnetic powder 2 and the binder was set so that the filling rate of the magnetic powder 2 in the finally obtained compound was 15% by volume. Next, the obtained mixture was kneaded for 20 minutes using a Labo Plastomill [product name, Toyo Seiki Seisaku-sho, Ltd.] at a set temperature of 200° C. and a rotation speed of 50 rpm to obtain a compound.

2. Production of Radio Wave Absorber

The obtained compound was molded using a heating press device under the conditions of a molding pressure of 20 MPa, a press temperature of 200° C., and a press time of 10 minutes to obtain a sheet-shaped radio wave absorber (size: 100 mm×100 mm). The using amount of the compound was such that the thickness of the finally obtained radio wave absorber was 4.5 mm.

Example 4

The same operation as in Example 3 was carried out to obtain a sheet-shaped radio wave absorber (size: 100 mm×100 mm), except that the blending amount of the magnetic powder 2 and the above binder was changed to an amount such that the filling rate of the magnetic powder 2 in the finally obtained compound was 30% by volume and the using amount of the compound was changed to an amount such that the thickness of the finally obtained radio wave absorber was 3 mm.

Comparative Example 6

The same operation as in Example 3 was carried out to obtain a sheet-shaped radio wave absorber (size: 100 mm×100 mm), except that the blending amount of the magnetic powder 2 and the above binder was changed to an amount such that the filling rate of the magnetic powder 2 in the finally obtained compound was 40% by volume and the using amount of the compound was changed to an amount such that the thickness of the finally obtained radio wave absorber was 2 mm.

"The filling rate of the magnetic powder in the radio wave absorbing layer (unit: % by volume)", "the thickness of the radio wave absorbing layer (unit: mm)", and "(P/100)×Q" in the radio wave absorber of each of Example 3, Example 4, and Comparative Example 6 are shown in Table 2.

[Measurement]

1. Measurement (1) of Transmission Attenuation Amount and Reflection Attenuation Amount The transmission attenuation amount (unit: dB) and the reflection attenuation amount (unit: dB) of the radio wave absorber of each of Example 1 to Example 4 and Comparative Example 1 to Comparative Example 6 were measured.

Specifically, it was measured as follows.

As the measurement device, a vector network analyzer (product name: N5225B) of Keysight Technologies and a horn antenna (product name: RH12S23) of KEYCOM Corp were used to measure an S parameter with a free space method by setting an incidence angle to 0° and a sweep frequency to 60 GHz to 90 GHz. For the radio wave absorbers of Example 1, Example 2, and Comparative Example 1 to Comparative Example 5, the transmission attenuation amount and the reflection attenuation amount at 76.5 GHz were determined, and for the radio wave absorbers of Example 3, Example 4, and Comparative Example 6, the transmission attenuation amount and the reflection attenuation amount at 85.0 GHz were determined. The results are shown in Table 1 and Table 2, respectively.

TABLE 1

| | Comparative Example 1 | Example 1 | Comparative Example 2 | Example 2 | Comparative Example 3 | Compamtive Example 4 | Comparative Example 5 |
|---|---|---|---|---|---|---|---|
| Filling rate of magnetic powder [% by volume] | 15 | 15 | 30 | 30 | 40 | 40 | 50 |
| Thickness of radio wave absorbing layer [mm] | 3 | 4.5 | 2 | 3 | 2 | 3 | 2 |
| (P/100) × Q | 0.45 | 0.68 | 0.60 | 0.90 | 0.80 | 1.20 | 1.00 |
| Transmission attenuation amount (76.5 GHz) [dB] | 5.6 | 11.0 | 8.7 | 16.0 | 13.8 | 24.1 | 19.0 |
| Reflection attenuation amount (76.5 GHz) [dB] | 13.5 | 13.2 | 10.6 | 10.4 | 7.4 | 7.6 | 6.0 |

TABLE 2

| | Example 3 | Example 4 | Comparative Example 6 |
|---|---|---|---|
| Filling rate of magnetic powder [% by volume] | 15 | 30 | 40 |
| Thickness of radio wave absorbing layer [mm] | 4.5 | 3 | 2 |
| (P/100) × Q | 0.68 | 0.90 | 0.80 |
| Transmission attenuation amount (85.0 GHz) [dB] | 10.5 | 15.5 | 13.3 |
| Reflection attenuation amount (85.0 GHz) [dB] | 14.4 | 11.1 | 7.9 |

As shown in Table 1 and Table 2, it was confirmed that in all of the radio wave absorbers of Example 1 to Example 4, both the transmission attenuation amount and the reflection attenuation amount were 10 dB or more in the millimeter wave band.

On the other hand, it was confirmed that in all of the radio wave absorbers of Comparative Example 1 to Comparative Example 6, at least one of the transmission attenuation amount or the reflection attenuation amount was less than 10 dB.

Production of Radio Wave Absorber (3)

Example 5

1. Production of Compound

A compound was prepared using the magnetic powder 1 and a binder [trade name: MILASTOMER (registered trade name) 7030NS, an olefin-based thermoplastic elastomer (TPO), Mitsui Chemicals, Inc.]. Specifically, it was prepared as follows.

The magnetic powder 1 and the above binder were mixed to obtain a mixture. The blending amount of the magnetic powder 1 and the binder was set so that the filling rate of the magnetic powder 1 in the finally obtained compound was 30% by volume. Next, the obtained mixture was kneaded for 20 minutes using a Labo Plastomill [product name, Toyo Seiki Seisaku-sho, Ltd.] at a set temperature of 200° C. and a rotation speed of 50 rpm to obtain a compound.

2. Production of Radio Wave Absorber

By using a biaxial kneading extruder [model: KZW15TW, TECHNOVEL Corporation] and setting the screw temperature to 200° C., the molten compound of the obtained compound was extruded from a die into a cylindrical shape to obtain a cylindrically shaped radio wave absorber (circular inner diameter: 100 mm, height: 150 mm, thickness: 3 mm).

What is claimed is:

1. A radio wave absorber comprising:
   a radio wave absorbing layer containing a magnetic powder and a binder,
   wherein a metal layer is not provided,
   a filling rate of the magnetic powder in the radio wave absorbing layer is 35% by volume or less, and
   in a case where the filling rate of the magnetic powder in the radio wave absorbing layer is denoted by P % by volume and a thickness of the radio wave absorbing layer is denoted by Q mm, the following relationship is satisfied, $0.65 \leq (P/100) \times Q$,
   wherein the magnetic powder includes a powder of a magnetoplumbite-type hexagonal ferrite.

2. The radio wave absorber according to claim 1,
   wherein the thickness of the radio wave absorbing layer is 10 mm or less, and the filling rate is 8% by volume or more and 35% by volume or less.

3. The radio wave absorber according to claim 1,
   wherein the thickness of the radio wave absorbing layer is 5 mm or less, and the filling rate is 15% by volume or more and 35% by volume or less.

4. The radio wave absorber according to claim 1, wherein the magnetic powder includes a powder of a magnetoplumbite-type hexagonal ferrite represented by Formula (1), $$AFe_{(12-x)}Al_xO_{19} \qquad \text{Formula (1)}$$

in Formula (1), A represents at least one kind of metal element selected from the group consisting of Sr, Ba, Ca, and Pb, and x satisfies $1.5 \leq x \leq 8.0$.

5. The radio wave absorber according to claim 4,
   wherein A in Formula (1) is Sr.

6. The radio wave absorber according to claim 4, wherein x in Formula (1) satisfies $1.5 \leq x \leq 6.0$.

7. The radio wave absorber according to claim 1,
   wherein in a case where a mode is denoted by a mode diameter, a 10% cumulative diameter is denoted by $D_{10}$, and a 90% cumulative diameter is denoted by $D_{90}$ in a number-based particle size distribution measured by a laser diffraction and scattering method, the magnetic powder has a mode diameter of 5 μm or more and less than 10 μm, and satisfies, $(D_{90}-D_{10})/\text{mode diameter} \leq 3.0$.

8. The radio wave absorber according to claim 1,
   wherein the radio wave absorber has a planar shape.

9. The radio wave absorber according to claim 1, wherein the radio wave absorber has a three-dimensional shape.

* * * * *